United States Patent
Rachmady et al.

(10) Patent No.: US 10,748,900 B2
(45) Date of Patent: Aug. 18, 2020

(54) FIN-BASED III-V/SI OR GE CMOS SAGE INTEGRATION

(71) Applicant: Intel Corporation, Santa Clara, CA (US)

(72) Inventors: Willy Rachmady, Beaverton, OR (US); Matthew V. Metz, Portland, OR (US); Gilbert Dewey, Hillsboro, OR (US); Chandra S. Mohapatra, Beaverton, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/771,080

(22) PCT Filed: Dec. 22, 2015

(86) PCT No.: PCT/US2015/067432
§ 371 (c)(1),
(2) Date: Apr. 25, 2018

(87) PCT Pub. No.: WO2017/111954
PCT Pub. Date: Jun. 29, 2017

(65) Prior Publication Data
US 2018/0315757 A1 Nov. 1, 2018

(51) Int. Cl.
*H01L 21/70* (2006.01)
*H01L 27/092* (2006.01)
(Continued)

(52) U.S. Cl.
CPC ...... *H01L 27/0924* (2013.01); *H01L 21/8258* (2013.01); *H01L 21/823807* (2013.01);
(Continued)

(58) Field of Classification Search
CPC ......... H01L 27/0924; H01L 21/823878; H01L 27/0886; H01L 21/823871; H01L 21/8258; H01L 21/823821; H01L 21/823807
See application file for complete search history.

(56) References Cited

U.S. PATENT DOCUMENTS 9,165,837 B1 10/2015 Fronheiser et al.
2008/0258231 A1* 10/2008 Yoneda ............... H01L 21/8249
257/370

(Continued)

FOREIGN PATENT DOCUMENTS

| WO | WO-2015094305 | 6/2015 |
| WO | WO 2015-147858 | 10/2015 |

OTHER PUBLICATIONS

International Search Report and Written Opinion for International Patent Application No. PCT/US2015/067432 dated Sep. 20, 2016, 11 pgs.

(Continued)

*Primary Examiner* — Ismail A Muse
(74) *Attorney, Agent, or Firm* — Schwabe, Williamson & Wyatt, P.C.

(57) ABSTRACT

Embodiments of the invention include a semiconductor structure and a method of making such a structure. In one embodiment, the semiconductor structure comprises a first fin and a second fin formed over a substrate. The first fin may comprise a first semiconductor material and the second fin may comprise a second semiconductor material. In an embodiment, a first cage structure is formed adjacent to the first fin, and a second cage structure is formed adjacent to the second fin. Additionally, embodiments may include a first gate electrode formed over the first fin, where the first cage structure directly contacts the first gate electrode, and a (Continued)

second gate electrode formed over the second fin, where the second cage structure directly contacts the second gate electrode.

22 Claims, 6 Drawing Sheets (51) Int. Cl.
   *H01L 21/8238* (2006.01)
   *H01L 21/8258* (2006.01)
   *H01L 27/088* (2006.01)

(52) U.S. Cl.
   CPC .......... *H01L 21/823821* (2013.01); *H01L 21/823871* (2013.01); *H01L 21/823878* (2013.01); *H01L 27/0886* (2013.01)

(56) References Cited

U.S. PATENT DOCUMENTS

| | | | |
|---|---|---|---|
| 2012/0299110 A1 | 11/2012 | Hung et al. | |
| 2013/0234147 A1 | 9/2013 | Wu et al. | |
| 2013/0249003 A1* | 9/2013 | Oh | H01L 21/845 257/347 |
| 2014/0027860 A1 | 1/2014 | Glass et al. | |
| 2014/0103397 A1* | 4/2014 | Pillarisetty | B82Y 10/00 257/192 |
| 2015/0001468 A1* | 1/2015 | Huang | H01L 29/66977 257/24 |
| 2015/0091190 A1 | 4/2015 | Smayling | |
| 2015/0162404 A1* | 6/2015 | Yang | H01L 21/82343 257/401 |
| 2015/0162437 A1* | 6/2015 | Oh | H01L 29/66477 257/288 |
| 2015/0270289 A1 | 9/2015 | Caimi et al. | |
| 2016/0064288 A1* | 3/2016 | Cheng | H01L 29/165 257/192 |
| 2016/0104708 A1* | 4/2016 | Kim | H01L 29/7854 257/369 |
| 2016/0141288 A1* | 5/2016 | Weng | H01L 21/8258 257/192 |
| 2016/0149036 A1* | 5/2016 | Huang | H01L 29/7848 257/401 |
| 2016/0211261 A1* | 7/2016 | Liu | H01L 27/0924 |
| 2016/0218104 A1* | 7/2016 | Wen | H01L 21/845 |
| 2016/0233319 A1* | 8/2016 | Lu | H01L 29/66795 |
| 2016/0260719 A1* | 9/2016 | Chung | H01L 27/1104 |
| 2016/0276341 A1* | 9/2016 | You | H01L 27/0886 |
| 2016/0322392 A1* | 11/2016 | Mochizuki | H01L 29/0657 |
| 2016/0336320 A1* | 11/2016 | Lin | H01L 27/0924 |
| 2016/0351568 A1* | 12/2016 | Chang | H01L 29/785 |
| 2016/0372316 A1* | 12/2016 | Yang | H01L 27/0924 |
| 2016/0372552 A1* | 12/2016 | Balakrishnan | H01L 29/785 |
| 2017/0069630 A1* | 3/2017 | Cha | H01L 27/0924 |
| 2017/0092547 A1* | 3/2017 | Tang | H01L 29/0653 |
| 2017/0104012 A1* | 4/2017 | Cheng | H01L 27/1211 |

OTHER PUBLICATIONS

International Preliminary Report on Patentability for PCT Patent Application No. PCT/US2015/067432 dated Jul. 5, 2018, 8 pgs.
Search Report for European Patent Application No. 15911633.4, dated Jul. 16, 2019, 10 pgs.
Office Action from Taiwan Patent Application No. 105138120, dated May 22, 2020, 10 pgs.

* cited by examiner

FIN-BASED III-V/SI OR GE CMOS SAGE INTEGRATION

CROSS-REFERENCE TO RELATED APPLICATION

This patent application is a U.S. National Phase Application under 35 U.S.C. § 371 of International Application No. PCT/US2015/067432, filed Dec. 22, 2015, entitled "FIN-BASED III-V/SI OR GE CMOS SAGE INTEGRATION," which designates the United States of America, the entire disclosure of which is hereby incorporated by reference in its entirety and for all purposes.

FIELD OF THE INVENTION

Embodiments of the invention are in the field of semiconductor devices and processing and, in particular, integration of self-aligned gate edge structures in CMOS devices that include non-planar N-type and P-type transistors that have different semiconductor materials used for their channel regions.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, tri-gate transistors may be electrically coupled to form complementary metal-oxide-semiconductor (CMOS) devices. CMOS devices include complementary pairs of N-type and P-type transistors that may be coupled together to perform logic operations.

Figure 1A:
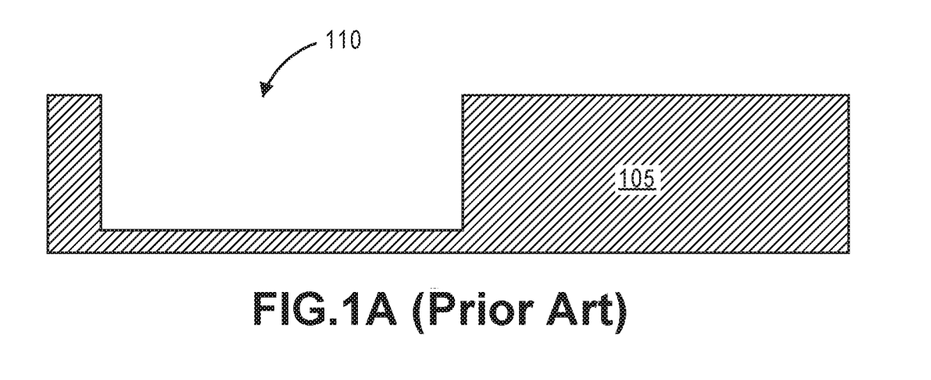
FIG. 1A is a cross-sectional illustration of a semiconductor substrate that has an opening etched into the surface.
Figure 1B:
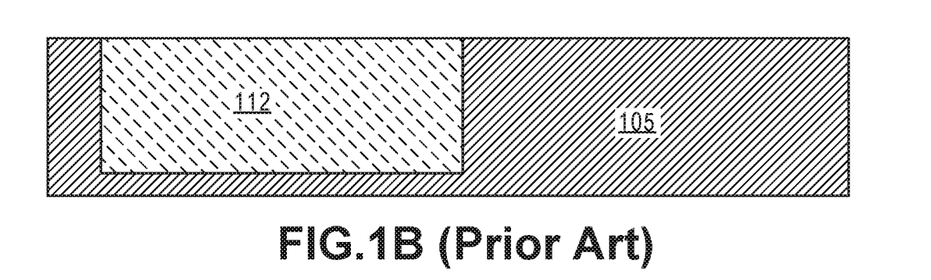
FIG. 1B is a cross-sectional illustration of a semiconductor substrate after a second semiconductor material is epitaxially grown in the opening of the semiconductor substrate.
Figure 1C:
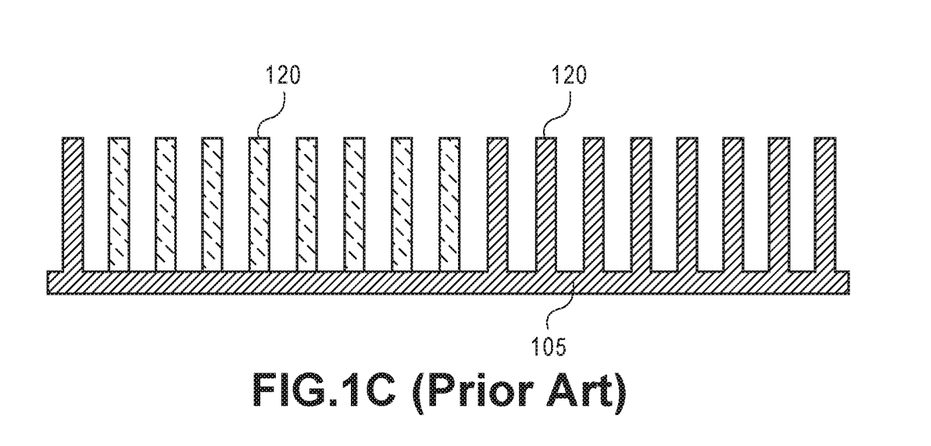
FIG. 1C is a cross-sectional illustration of a semiconductor substrate after a plurality of fins are formed with a dry-etching process.

In order to optimize the performance of the CMOS, it is often necessary to form the N-type and P-type transistors with different semiconductor materials. Typically, this is done by forming an island of a second semiconductor material in a first semiconductor substrate. For example, in FIG. 1A an opening 110 is etched into a silicon substrate 105. Thereafter, as illustrated in FIG. 1B, a second semiconductor material is epitaxially grown in the opening 110 to form an island region 112. A plurality of fins 120 may then be patterned into the substrate 105 and the island region 112 with a dry-etching process, as illustrated in FIG. 1C. However, as the critical dimension of the fins continues to be reduced, the dry-etching process begins to create problems.

Anisotropic dry-etching processes, such as those used to form high aspect ratio fins, typically include a combination of ion-bombardment and passivation. The passivation layer forms over the exposed surfaces, and the ion bombardment removes the passivation layer and the material being etched from the exposed planar surfaces. As such, the dry-etching process exposes the semiconductor material to a passivating species and is bombarded by ions. Accordingly, the dry-etching process may introduce impurities and generate surface defects in the etched fin that negatively impact the performance of tri-gate transistor devices made with the fins 120. It has been found that III-V semiconductor materials are particularly vulnerable to forming surface defects when exposed to dry-etching processes. Therefore, when an island region is formed with a III-V semiconductor material, the resulting fins formed with a dry-etching process may have poor performance characteristics compared to the fins formed in other portions of the semiconductor substrate.

DETAILED DESCRIPTION OF THE INVENTION

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

One or more embodiments of the present invention are directed to semiconductor structures or devices having one or more self-aligned gate edge (SAGE) structures formed around at least a first type of fin formed from a first semiconductor material and a second type of fin formed from a second semiconductor material. According to an embodiment, the second semiconductor material is a III-V semiconductor and the fins formed with the second type of semiconductor material are not exposed to a dry-etching process.

As described above, the integration of fins with different semiconductor materials is typically done by epitaxially growing an island of the second semiconductor material within a semiconductor substrate of a first semiconducting material. After the island is formed, both semiconducting materials are patterned with a dry-etching process. In contrast, embodiments of the present invention, include patterning the fins with a dry-etching process prior to epitaxially growing the second semiconductor material. A shallow trench isolation (STI) layer may then be formed around the first fins. The second type of fins may then be formed by removing one or more of the first fins to form replacement fin openings in the STI layer. Sidewalls of the replacement fin openings confine the epitaxial growth of the second semiconductor material so that the replacement fins have substantially the same shape as the first fins that were patterned. Accordingly, the second semiconductor material can be formed into a high aspect ratio fin without being exposed to a dry-etching process. Therefore, embodiments of the invention allow for the second type of fins to be formed with a III-V semiconductor material that is substantially free of surface defects, as would otherwise be the case if the III-V semiconductor material was exposed to the dry-etching process.

Figure 2A:
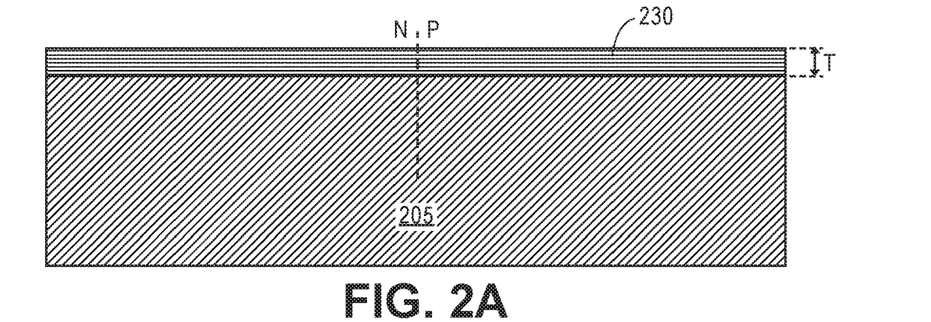
FIG. 2A is a cross-sectional illustration of a semiconductor substrate that includes a cap layer, according to an embodiment of the invention.

Referring now to FIG. 2A, a cross-sectional illustration of a semiconductor substrate 205 is shown according to an embodiment of the invention. According to an embodiment, the material used to form the semiconductor substrate 205 may be referred to as the first semiconductor material. The first semiconductor material may be any suitable semiconductor material that can be etched with a dry-etching process without causing significant surface damage to the remaining portions of the semiconductor material. For example, the semiconductor substrate 205 may be a crystalline substrate formed using a bulk silicon or a silicon-on-insulator substructure.

According to an embodiment of the invention, a cap layer 230 may be formed over the top surface of the semiconductor substrate 205. The cap layer 230 may be a semiconducting material that can be selectively etched with respect to the semiconductor substrate 205. For example, when the semiconductor substrate 205 is a silicon substrate, the cap layer 230 may be silicon germanium (SiGe). According to an embodiment, the cap layer 230 is epitaxially grown. The thickness T of the cap layer 230 may be chosen to provide a desired gate thickness above the channel in the finished transistor device, as will described in greater detail below.

Figure 2B:
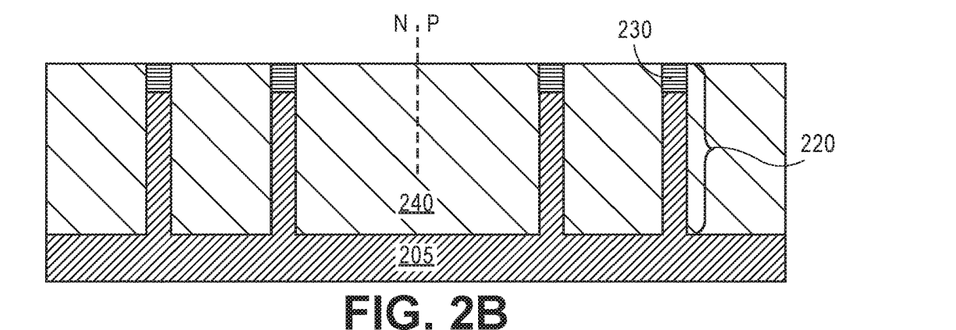
FIG. 2B is a cross-sectional illustration of the semiconductor substrate after fins are formed and a shallow trench isolation (STI) layer is formed between the fins, according to an embodiment of the invention.

Referring now to FIG. 2B, a cross-sectional illustration of the semiconductor substrate 205 is shown after the fins 220 have been patterned. According to embodiments of the invention, the fins 220 may be high aspect ratio fins, such as fins with a height to width ratio of 2:1 or greater. Embodiments of the invention include fins 220 that have a height between approximately 20 nm and 150 nm and have widths between approximately 5 nm and 30 nm. The fins 220 may be formed with any well-known technique such as masking and etching. Embodiments of the invention include forming the fins 220 with a dry-etching process. Accordingly, the fins 220 formed in the N-type region (left side of FIG. 2B) and the P-type region (right side of FIG. 2B) may be formed with a single dry-etching process.

According to an embodiment, an STI layer 240 may be formed between each of the fins 220. In an embodiment, any overburden formed above a top surface of the fins 220 may be polished back to ensure that a top surface of the cap layer 230 of each fin is exposed. According to an embodiment, the STI layer 240 may be any suitable oxide, nitride, or any other insulating material, or a combination of two or more of dielectric materials. For example, the STI layer 240 may be a silicon dioxide or an oxynitride.

Figure 2C:
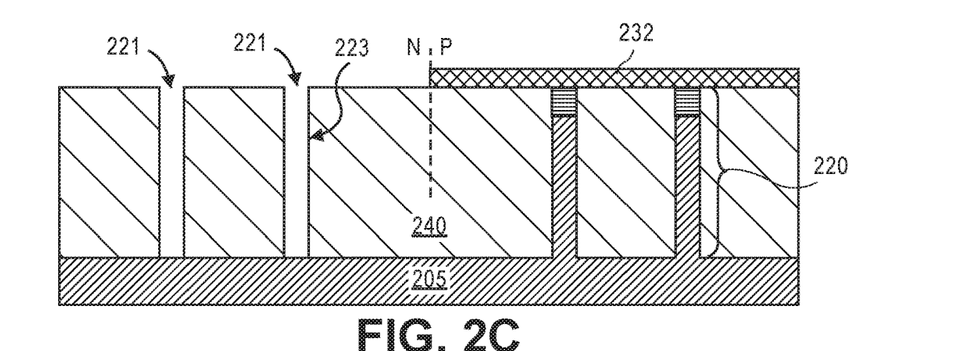
FIG. 2C is a cross-sectional illustration of the semiconductor substrate after the fins in the N-type region of the substrate are removed, according to an embodiment of the invention.

As described above. CMOS devices often require the use of different semiconductor materials for the N-type and P-type transistors. However, instead of forming an island region of the second semiconductor material in the N-type region, embodiments of the invention may include forming replacement fins. As illustrated in FIG. 2C, the fins 220 in the N-type region are removed. According to an embodiment, an etch mask 232 may be deposited over the P-type regions of the device in order to prevent the fins 220 in the P-type region from being recessed. Thereafter, the fins 220 in the N-type region may be etched away to form replacement fin openings 221. In order to remove both the cap layer 230 and the fins 220, some embodiments may include multiple etching chemistries due to the etch selectivity between the materials.

The replacement fin openings 221 provide a structure in which replacement fins formed with a second semiconductor material may be epitaxially grown. According to an embodiment, the replacement fin openings 221 may be substantially the same shape as the original fins 220. Accordingly, the epitaxial growth of the second semiconductor material is confined by the sidewalls 223 and allows the replacement fins to be high aspect ratio fins without needing to be patterned with a dry-etching process. In another embodiment, a portion of the substrate 205 may be removed after the fins 220 are removed. For instance, a portion of the substrate 205 may be etched along facets of the semiconductor crystal the substrate 205 is formed from in order to provide a faceted surface on which the subsequent epitaxial growth can occur.

Figure 2D:
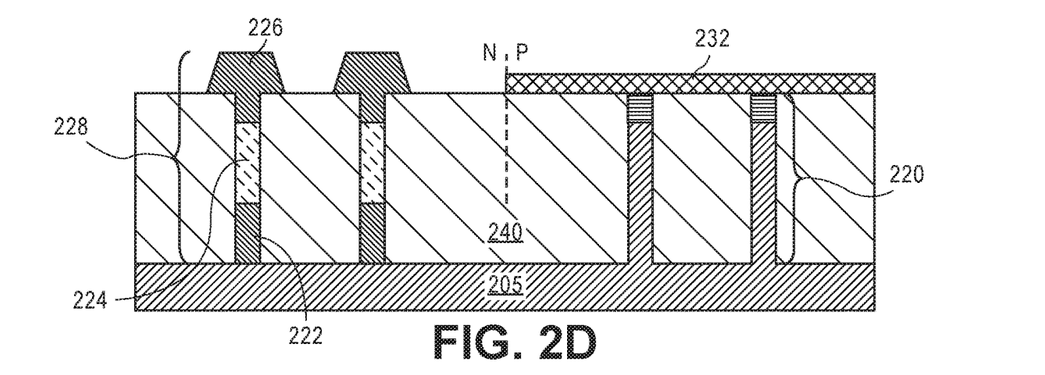
FIG. 2D is a cross-sectional illustration of the semiconductor substrate after replacement fins are grown in the fin openings in the N-type region of the substrate, according to an embodiment of the invention.

Referring now to FIG. 2D, a cross-sectional illustration of the semiconductor substrate 205 after the replacement fins 228 are formed in the replacement fin openings 221 is shown according to an embodiment of the invention. According to an embodiment, the replacement fins 228 may be epitaxially grown. Since the etch mask 232 is still formed over a top surface of the P-type region, the epitaxial growth will be limited to the N-type regions. The epitaxial growth is confined by the sidewalls 223 of the replacement fin openings 221. As such, the epitaxially grown replacement fins 228 are able to be high aspect ratio fins suitable for use in non-planar transistors such as tri-gate transistors.

The replacement fins 228 may include one or more different layers of semiconductor material. For example, the illustrated embodiment in FIG. 2D includes three layers of epitaxially grown semiconductor materials. In an embodiment, the different layers of the replacement fin 228 may include a buffer layer 222, an active region 224, and a cap region 226. In embodiments of the invention, the replacement fins 228 may include one or more different III-V semiconductor materials (e.g., aluminum arsenide (AlAs), aluminum antimonide (AlSb), gallium nitride (GaN), gallium phosphide (GaP), gallium arsenide (GaAs), indium phosphide (InP), indium gallium arsenide (InGaAs), or the like). While the use of III-V semiconductor materials may be desirable for improving performance characteristics of N-type transistors, it is to be appreciated that any semiconductor material may be epitaxially grown in the replacement fin openings 221, depending on the specific needs of the device.

Embodiments of the invention may include features that reduce the defect density in the active region 224 of the replacement fin 228. For example, one or more buffer layers 222 may be used to transition the lattice spacing from a first lattice spacing of the first semiconductor material used to form the substrate 205 to a second lattice spacing of a second semiconductor material used to form the active region 224. Transitioning the lattice spacing with one or more buffer layers 222 allows for epitaxial growth of the active region 224 to have fewer defects due to the lattice mismatch. In some embodiments, the buffer layer 222 may be referred to as a graded buffer layer. A graded buffer layer may include a bottom surface that has a lattice spacing that is different than a lattice spacing of a top surface of the buffer layer 222. Additionally, the high aspect ratio of the replacement fin openings 221 may also reduce the dislocation density through aspect ratio trapping (ART). ART allows for dislocations in the lattice to propagate towards the sidewalls 223. Once the dislocation reaches the sidewall, the dislocation is terminated and the replacement fin 228 will, therefore, have a reduced dislocation density in the active region 224.

In addition to reducing the dislocation density, a buffer layer 222 may also improve the electrical performance of the finished transistor. In embodiments that include a buffer layer 222 that has a conduction band offset from the semiconductor material used for the active region 224, a semi-insulating effect may be produced. The semi-insulating effect limits the flow of carriers from the active region 224 into the substrate 205 during operation of the device. For example, a conduction band offset that provides a semi-insulating effect may be produced when the active region 224 is InGaAs and the buffer layer 222 is GaAs.

Additional embodiments of the invention may also include forming a cap layer 226 over a top surface of the active region 224. According to an embodiment, the cap layer 226 may be a material that can be selectively etched with respect to the active region 224. Accordingly, the cap layer 226 may allow for the thickness of the gate formed over the active region 224 to be controlled, similar to the cap layer 230. By way of example, the cap layer 226 may be GaAs when the active region 224 is InGaAs. As illustrated in FIG. 2D, the epitaxial growth of the replacement fin 228 may extend above a top surface of the STI 240. Since the epitaxial growth is no longer confined, portions of the cap layer 226 may extend laterally along the top surface of the STI 240. In such embodiments the overburden may be removed with a polishing operation so that a top surface of the cap layer 226 is substantially coplanar with a top surface of the STI 240.

According to an embodiment, the thickness of each layer of the replacement fin 228 may be controlled to provide the desired electrical properties to the finished transistor. For example, the thickness of the active region 224 may be any desired thickness up to the height of the original fins 220. In one embodiment, the thickness of the active region 224 may be greater than or less than the thickness of the active channel region that will be formed in the transistors in the P-type region. The ability to tailor the thickness of the channel in the replacement fin 228 allows for differences in performance between the transistors in the N-type region and the P-type region to be modified to account for the differences in performance, therefore producing balanced transistors in both regions of the CMOS device.

Additional embodiments of the invention may also include forming replacement fins in the P-type region as well. For example, the fins in the N-type region may be masked off and the original fins 220 in the P-type region may be etched back in substantially the same manner as described above with respect to the fins in the N-type region. Replacement fins (not shown) may then be epitaxially grown in the P-type region. Embodiments of the invention may include growing P-type replacement fins with any suitable P-type semiconducting material or stack of semiconductor materials (e.g., buffer layers, channel layers, and the like). In one embodiment, the P-type replacement fins may include a Ge channel region. By way of example, a suitable epitaxially grown Ge channel region may be formed with a semiconductor stack such as a SiGe/Ge/SiGe stack.

Figure 2E:
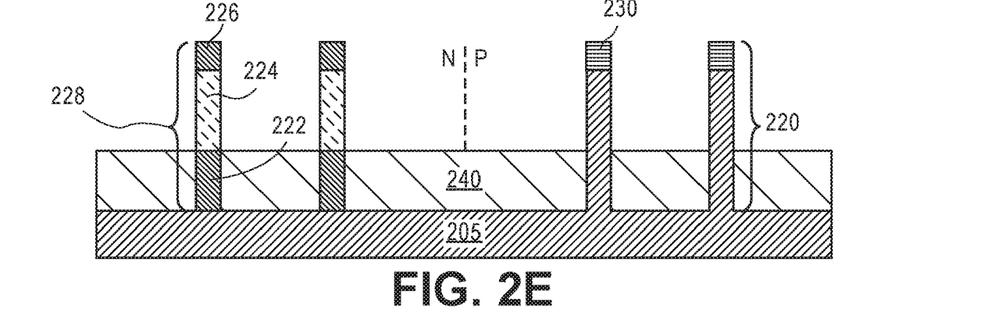
FIG. 2E is a cross-sectional illustration of the semiconductor substrate after the STI layer is recessed below a top surface of the fins, according to an embodiment of the invention.

Referring now to FIG. 2E, a cross-sectional illustration of the semiconductor substrate 205 after the STI 240 is recessed is shown according to an embodiment of the invention. Recessing the STI 240 provides the desired dimensions for the channel in tri-gate transistor devices. For example, the thickness of the active channel region in fins 220 may be defined by the amount the STI 240 is recessed. In the illustrated embodiment, the STI 240 is recessed such that the top surface of the STI 240 is substantially coplanar with a bottom surface of the active region 224 in the replacement fins 228. However, embodiments are not limited to such configurations, and the top surface of the STI 240 may be above or below a bottom surface of the active region 224, according to different embodiments.

After the STI 240 is recessed, the processing proceeds with the formation of the gate structure. As noted above, scaling continues to shrink the transistor sizes and alignment of patterned features becomes increasingly critical. Typically, the dimensions of the gate endcaps (i.e., the portion of the gate electrode that is formed along the sidewalls of the fins) must include an allowance for mask registration error to ensure robust transistor operation for worst case mis-registration. The additional allowance needed for mask registration error increases the needed end-to-end spacing between gate endcaps formed on neighboring fins. Scaling transistors to smaller sizes is, therefore, limited by the lithographic patterning process used to define the gate electrodes. In order to eliminate extra spacing between gate endcaps needed to account for mask mis-registration, embodiments of the invention include self-aligned gate endcaps. The use of a self-aligned feature removes the possibility of mask registration error, because there is no longer a patterning operation that requires masks in order to define the gate endcaps. Accordingly, embodiments of the invention allow for scaling of non-planar transistor devices beyond the capabilities available with lithographic patterning.

Figure 2F:
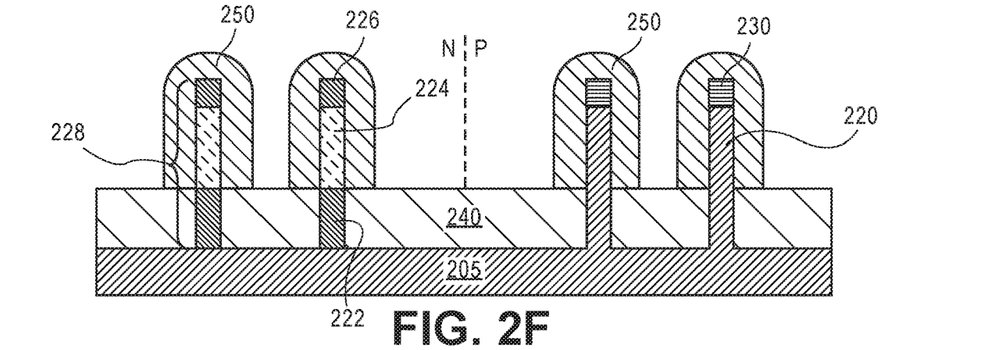
FIG. 2F is a cross-sectional illustration of the semiconductor substrate after cage spacers are formed over the exposed surfaces of the fins, according to an embodiment of the invention.

Referring now to FIG. 2F, a cross-sectional illustration of the semiconductor substrate 205 after cage spacers 250 are formed over the exposed portions of the fins 220 and 228 is shown according to an embodiment of the invention. The cage spacers 250 are a sacrificial layer that allows for the width of the gate endcaps formed along the sidewall of the fins in a subsequent processing operation to be a controlled width and self-aligned with fin. The improved alignment obtained by the self-aligning features allows for the spacing between neighboring fins 220 or 228 to be reduced.

According to an embodiment, the cage spacers 250 may be any suitable material that can be conformally deposited over the fins 220 and 228, and that can be etched with an anisotropic etching process. For example, the cage spacers 250 may be formed with a conformal blanket deposition of the cage spacer material 250. In an embodiment, the cage spacer material may be deposited with atomic layer deposition (ALD), chemical vapor deposition (CVD), or the like. For example, the cage spacer material may be a silicon oxide, a silicon nitride, or the like. After the cage spacer material has been deposited, an anisotropic etching process that selectively etches the planar surfaces (e.g., a plasma etching process, or the like), may be used to remove the portions of the cage spacer material that is formed along planar surfaces. As such, the cage spacers 250 formed along the sidewalls of the fins remain. In the illustrated embodiment, portions of the cage spacer 250 may remain above a top portion of the fins 220 and 228, though in other embodiments, the cage spacer etching process may substantially remove the cage spacer material from the top surface of the fins as well.

Figure 2G:
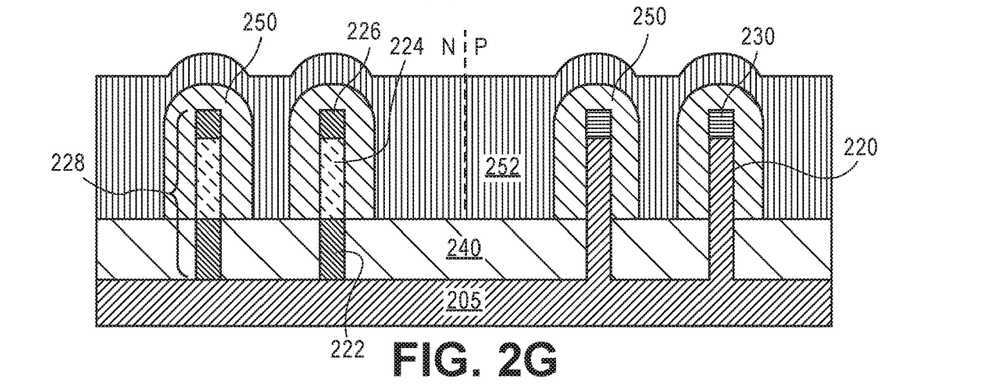
FIG. 2G is a cross-sectional illustration of the semiconductor substrate after a cage fill material is disposed between and above the cage spacers, according to an embodiment of the invention.

Referring now to FIG. 2G, a cross-sectional illustration of the semiconductor substrate 205 after a cage fill material 252 is deposited is shown according to an embodiment of the invention. According to an embodiment, the cage fill material 252 is a material that is etch selective to the material used to form the cage spacers 250. For example, the cage fill material 252 may be a SiC. The cage fill material 252 may be deposited with a conformal deposition process that enables the cage fill material 252 to fill the openings between the cage spacers 250. Embodiments of the invention may include depositing the cage fill material 252 with ALD, CVD, a reflow process, or the like.

Figure 2H:
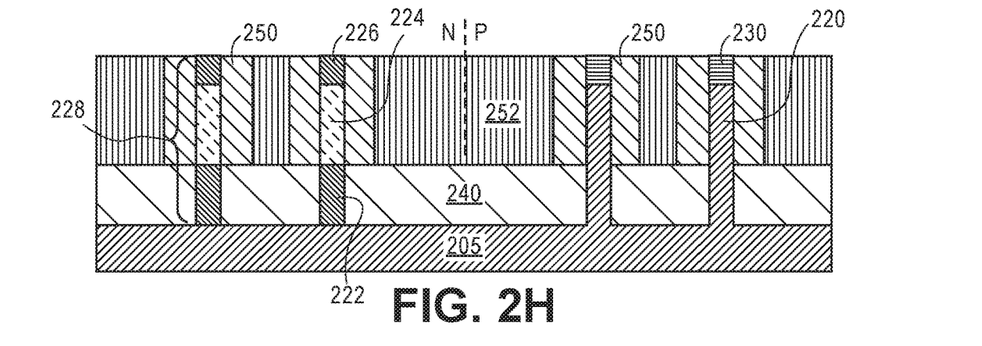
FIG. 2H is a cross-sectional illustration of the semiconductor substrate after the cage fill material and cage spacer layer are recessed and top surfaces of the fins are exposed, according to an embodiment of the invention.

Referring now to FIG. 2H, a cross-sectional illustration of the semiconductor substrate 205 after the cage fill material 252 is planarized with a top surface of the fins 220 and 228 is shown according to an embodiment of the invention. In an embodiment, the planarization process may be a polishing operation. In embodiments that include portions of the cage spacer 250 over a top portion of the fins 220 and 228, the polishing operation may also remove portions of the cage spacers 250. Accordingly, embodiments of the invention may include a polishing operation that exposes the top surfaces of the fins 220 and 228.

Figure 2I:
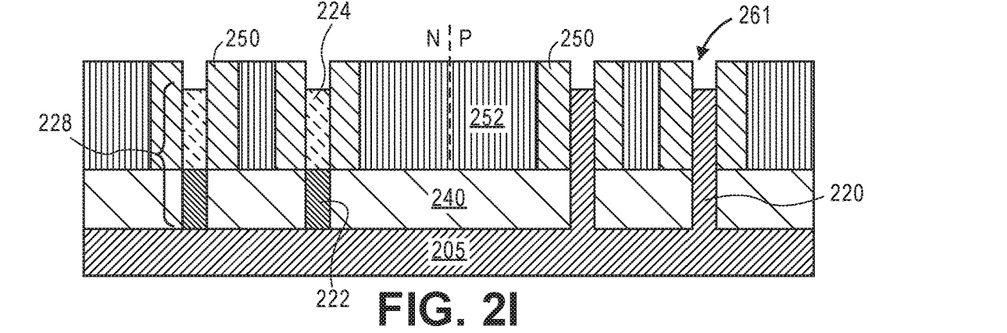
FIG. 2I is a cross-sectional illustration of the semiconductor substrate after the cap layer and the cap layer are removed, according to an embodiment of the invention.

Referring now to FIG. 2I, a cross-sectional illustration of the semiconductor substrate 205 after the cap layer 230 and the cap layer 226 are removed from the fins 220 and 228 is shown according to an embodiment of the invention. The removal of the cap layers 226 and 230 exposes a top surface of the fins 220 and 228. According to an embodiment, the cap layers 226 and 228 may be removed with one or more etching processes. For example, the cap layer 230 may be removed with a first etching process that selectively etches the cap layer 230 with respect to the first semiconductor material that forms the remainder of the fin 220, and the cap layer 226 may be removed with a second etching process that selectively etches the cap layer 226 with respect to the second semiconductor material that forms the active region 224. In one particular embodiment where the cap layer 230 is SiGe and the first semiconductor material is Si, the SiGe may be selectively etched with a citric or nitric acid. In one particular embodiment where the cap layer 226 is GaAs and the active region 224 is InGaAs, the GaAs may be selectively etched with a basic solution, such as tetramethylammonium hydroxide (TMAH). The use of materials that are selectively etched for each fin/cap pair allows for complete removal of the cap 226 or 230 without removal of portions of the underlying fin, even when the fins have small critical dimensions (e.g., critical dimensions less than 20 nm). It is to be appreciated that the use of a selective etch to remove the cap 226 from above the active region allows for the formation of a top surface of the active region 224 that is atomically smooth. In contrast, if a non-selective etch were used to remove the cap 226, then the top surface of the active region 224 would not be atomically smooth.

Figure 2J:
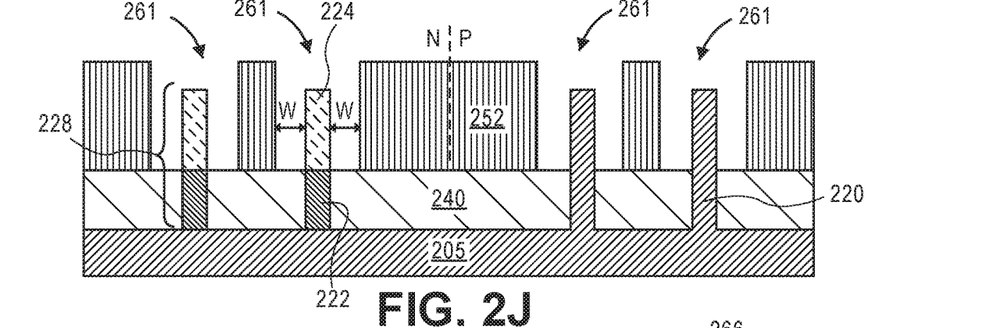
FIG. 2J is a cross-sectional illustration of the semiconductor substrate after the cage spacers are removed according to an embodiment of the invention.

Referring now to FIG. 2J, a cross-sectional illustration of the semiconductor substrate 205 after the cage spacers 250 have been removed is shown according to an embodiment of the invention. As illustrated, the removal of the cage spacers 250 provides a gate electrode opening 261 that exposes portions of the sidewalls of the fins 220 and the replacement fins 228. Since the cage spacers 250 prevented the cage fill material from being formed along the sidewalls of the fins, a controlled spacing with a width W is formed between the sidewall of the fins 220 and 228 and the sidewall of the cage 252. As such, embodiments of the invention include a cage 252 that is self-aligned with the fins 220 and 228 (i.e., the gate electrode openings 261 in the cage structure 252 are centered with the fins 220 and 228).

Figure 2K:
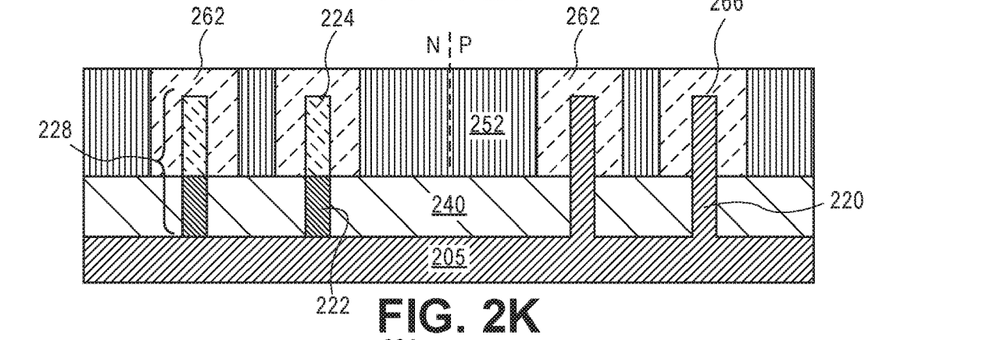
FIG. 2K is a cross-sectional illustration of the semiconductor substrate after dummy gate electrodes are deposited over the fins, according to an embodiment of the invention.

Referring now to FIG. 2K, a cross-sectional illustration of the semiconductor substrate 205 after a dummy gate electrode 262 is deposited into the gate electrode opening 261 is shown according to an embodiment of the invention. In the illustrated embodiment, the dummy gate electrode 262 is applied directly over the fins 220 and 228. However, it is to be appreciated that a dummy gate dielectric (not shown) may also be formed over the fins 220 and 228 prior to depositing the dummy gate electrode 262. In an embodiment, the dummy gate dielectric may be a conformal material, such as a silicon oxide or the like, and the dummy gate electrode 262 may be an amorphous or polycrystalline silicon. In alternate embodiments, the gate electrode 262 may be the final gate electrode structure and not a dummy gate, for example, if a "gate-first" process were to be employed.

According to an embodiment, overburden from depositing the dummy gate electrode 262 may be removed with a polishing operation. As illustrated, the top surface of the dummy gate electrode 262 may be recessed so that it is planar with a top surface of the cage 252. As such, the dummy gate electrode 262 is formed with a defined gate thickness over the top of the fins 220 and 228 that is substantially similar to the thickness of the cap layer 230 and the cap layer 226, respectively. Accordingly, when the cap layer 226 is a different thickness than the cap layer 230, embodiments of the invention may allow for the gate thickness over the fins to be different.

Figure 2L:
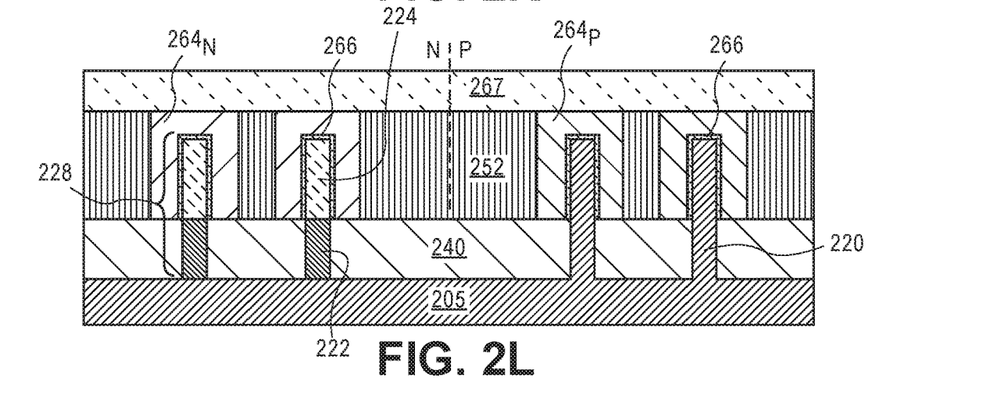
FIG. 2L is a cross-sectional illustration of the semiconductor substrate after the dummy gate electrodes are replaced with metal gate electrodes, according to an embodiment of the invention.

After the formation of the dummy gate electrodes 262 over the fins 220 and 228, embodiments of the invention may proceed with processing operations that are typically used to form non-planar transistors. For example, FIG. 2L is a cross-sectional illustration of the semiconductor substrate 205 after the dummy gate electrodes 262 are replaced with permanent gate electrodes 264. According to an embodiment, the dummy gate electrodes 262 may be replaced with the permanent gate electrodes 264 after one or more processes used to form the transistor device, such as, for example, forming source and drain regions (not shown) in the fins, or other doping, annealing, or diffusion processes, or any other process that may require elevated temperatures.

After the dummy gate electrodes 262 and the dummy gate dielectric are removed, embodiments of the invention may include depositing a permanent gate dielectric layer 266 over the exposed fins 220 and 228. The gate dielectric layer 266 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 266 to improve its quality when a high-k material is used.

According to an embodiment, the gate electrode 264 is formed on the gate dielectric layer 266 and may consist of at least a P-type workfunction metal or N-type workfunction metal, depending on whether the transistor is located on the P-type region or the N-type region of the device. Accordingly, the replacement gate process may be referred to as a dual metal gate replacement process in order to allow for the formation of gate electrodes 264 with a desired workfunction. In some implementations, the gate electrodes 264 may consist of a stack of two or more metal layers, where one or more metal layers are workfunction metal layers and at least one metal layer is a fill metal layer.

For the transistors formed in the P-type region of the device, metals that may be used for the gate electrode $264_P$ include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For the transistors formed in the N-type region of the device, metals that may be used for the gate electrode $264_N$ include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In the illustrated embodiment, the gate electrodes 264 may consist of a "U"-shaped structure that includes a top portion substantially parallel to the surface of the substrate 205 and two sidewall portions that are substantially perpendicular to the top surface of the substrate 205 (which may also be referred to as gate endcaps). Since the gate electrodes 264 fill the gate electrode openings in the cage structure 252, the gate electrodes 264 are also substantially centered with the fins 220 and 228. According to an embodiment, the cage structure 252 may remain in the final structure to isolate each gate electrode 264. In the illustrated embodiment, a local interconnect 267 may be formed to contact the N-type gate electrodes $264_N$ and the P-type gate electrodes $264_P$ to provide a conductive path over the cage structure 252 between the two regions.

Furthermore, it is to be appreciated that while fins 220 are shown in FIG. 2L, embodiments of the invention may also include a P-type region that includes replacement fins, as is described above with respect to FIG. 2D. In such embodiments, the fins in the P-type region may include different semiconductor materials than the substrate 205. For example, the fins in the P-type region may include a stack of III-V semiconductor material suitable for forming a P-type transistor. In one embodiment, a Ge channel P-type transistor may be formed in the P-type region by forming a SiGe/Ge/SiGe stack over the semiconductor substrate 205.

Figure 3:
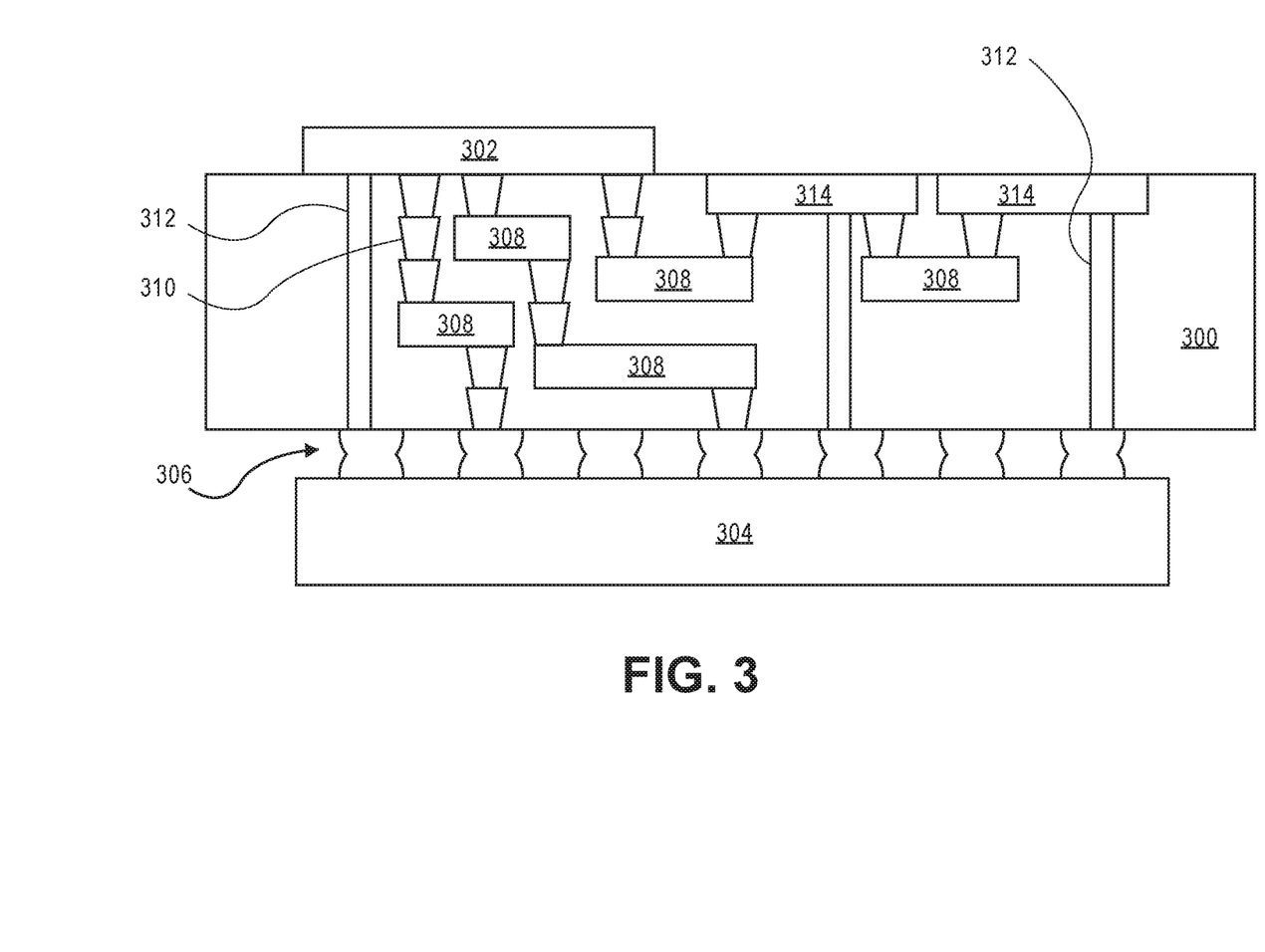
FIG. 3 is a cross-sectional illustration of an interposer implementing one or more embodiments of the invention.

FIG. 3 illustrates an interposer 300 that includes one or more embodiments of the invention. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. And in further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. The interposer 300 may further include embedded devices 314, including both passive and active devices.

Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300.

In accordance with embodiments of the invention, apparatuses that include one or more SAGE structures formed around at least a first type of fin formed from a first semiconductor material and a second type of fin formed from a second semiconductor material, or processes for forming such transistors disclosed herein may be used in the fabrication of interposer 300.

Figure 4:
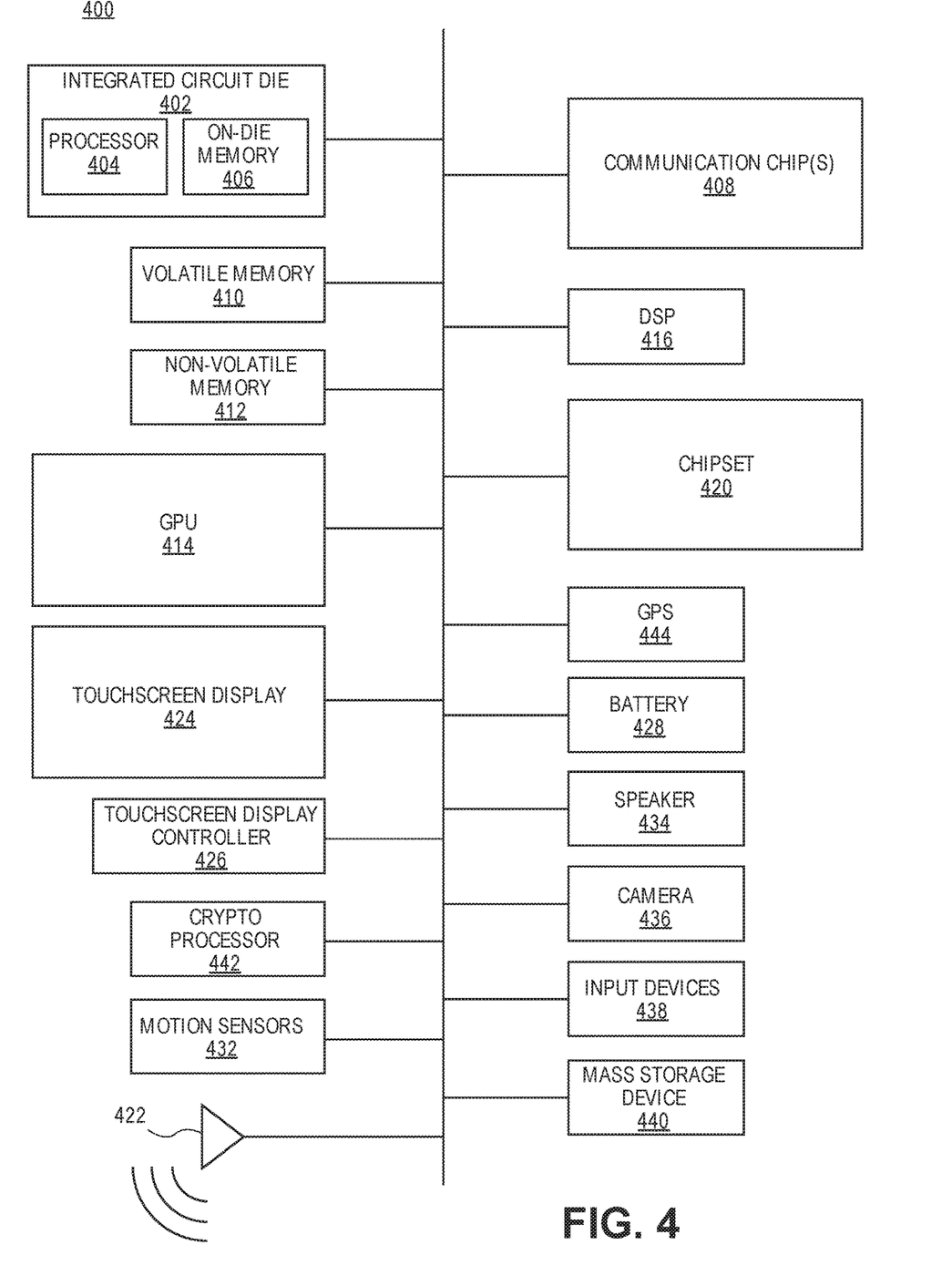
FIG. 4 is a schematic of a computing device that includes one or more transistors built in accordance with an embodiment of the invention.

FIG. 4 illustrates a computing device 400 in accordance with one embodiment of the invention. The computing device 400 may include a number of components. In one embodiment, these components are attached to one or more motherboards. In an alternate embodiment, these components are fabricated onto a single system-on-a-chip (SoC) die rather than a motherboard. The components in the computing device 400 include, but are not limited to, an integrated circuit die 402 and at least one communication chip 408. In some implementations the communication chip 408 is fabricated as part of the integrated circuit die 402. The integrated circuit die 402 may include a CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), a graphics processing unit 414 (GPU), a digital signal processor 416, a crypto processor 442 (a specialized processor that executes cryptographic algorithms within hardware), a chipset 420, an antenna 422, a display or a touchscreen display 424, a touchscreen controller 426, a battery 428 or other power source, a power amplifier (not shown), a global positioning system (GPS) device 444, a compass 430, a motion coprocessor or sensors 432 (that may include an accelerometer, a gyroscope, and a compass), a speaker 434, a camera 436, user input devices 438 (such as a keyboard, mouse, stylus, and touchpad), and a mass storage device 440 (such as hard disk drive, compact disk (CD), digital versatile disk (DVD), and so forth).

The communications chip 408 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 408. For instance, a first communication chip 408 may be dedicated to shorter range wireless communications such as Wi-Fi and Bluetooth and a second communication chip 408 may be dedicated to longer range wireless communications such as GPS, EDGE, GPRS, CDMA, WiMAX, LTE, Ev-DO, and others.

The processor 404 of the computing device 400 includes one or more devices, such as CMOS devices that include one or more SAGE structures formed around at least a first type of fin formed from a first semiconductor material and a second type of fin formed from a second semiconductor material, according to an embodiment of the invention. The term "processor" may refer to any device or portion of a device that processes electronic data from registers and/or memory to transform that electronic data into other electronic data that may be stored in registers and/or memory.

The communication chip 408 may also include one or more devices, such as one or more SAGE structures formed around at least a first type of fin formed from a first semiconductor material and a second type of fin formed from a second semiconductor material, according to an embodiment of the invention.

In further embodiments, another component housed within the computing device 400 may contain one or more devices, such as one or more SAGE structures formed around at least a first type of fin formed from a first semiconductor material and a second type of fin formed from a second semiconductor material, according to an embodiment of the invention.

In various embodiments, the computing device 400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a semiconductor structure comprising: a substrate; a first fin formed over the substrate, wherein the first fin includes a first semiconductor material; a first cage structure formed adjacent to the first fin, wherein each sidewall of the first fin is spaced away from a nearest sidewall of the first cage by a first spacing; a first gate electrode formed over the first fin, wherein the first cage structure directly contacts the first gate electrode; a second fin formed over the substrate wherein the second fin includes a second semiconductor material; a second cage structure formed adjacent to the second fin, wherein each sidewall of the second fin is spaced away from a nearest sidewall of the second cage by a second spacing; and a second gate electrode formed over the second fin, wherein the second cage structure directly contacts the second gate electrode.

Additional embodiments of the invention include a semiconductor structure, wherein the second semiconductor material is a III-V semiconductor material.

Additional embodiments of the invention include a semiconductor structure, wherein the second fin comprises: a buffer layer in contact with the substrate; and a channel region formed over the buffer layer, wherein the channel region is formed from the second semiconductor material.

Additional embodiments of the invention include a semiconductor structure, wherein a top surface of the channel region is atomically smooth.

Additional embodiments of the invention include a semiconductor structure, wherein the buffer layer is a graded buffer layer.

Additional embodiments of the invention include a semiconductor structure, wherein the buffer layer is GaAs and the channel region is InGaAs.

Additional embodiments of the invention include a semiconductor structure, wherein the first semiconductor material is a III-V semiconductor material that is different than the second semiconductor material, and wherein the first semiconductor material is a different material than the substrate.

Additional embodiments of the invention include a semiconductor structure, wherein the first fin further comprises a stack of semiconductor materials.

Additional embodiments of the invention include a semiconductor structure, wherein the stack of semiconductor materials in the first fin is a SiGe/Ge/SiGe stack, wherein the Ge portion forms a channel region in the first fin.

Additional embodiments of the invention include a semiconductor structure, wherein the first fin is a different height than the second fin.

Additional embodiments of the invention include a semiconductor structure, further comprising an interconnect that electrically couples the first gate electrode to the second gate electrode.

Additional embodiments of the invention include a semiconductor structure, wherein the semiconductor structure forms a complementary metal-oxide-semiconductor (CMOS) device.

Additional embodiments of the invention include a semiconductor structure, wherein the first fin is a component of a P-type transistor and the second fin is a component of an N-type transistor.

Additional embodiments of the invention include a semiconductor structure, wherein the first gate electrode is a different material than the second gate electrode.

Embodiments of the invention include a method of forming a semiconductor structure, comprising: forming a cap layer over a substrate formed with a first semiconductor material, wherein the cap layer is etch selective to the first semiconductor material; forming a first and a second fin in the substrate; forming a shallow trench isolation (STI) layer over the substrate and around the first and second fins; removing the second fin to form an opening in the STI layer: epitaxially growing a second semiconductor material in the opening to form a replacement fin; recessing the STI layer; forming spacers adjacent to the sidewalls of each of the first fin and the replacement fin; forming cage structures adjacent to the spacers; removing the spacers to form an opening between at least one cage structure and the first fin and to form an opening between at least one cage structure and the replacement fin; forming a first gate electrode over the first fin; and forming a second gate electrode over the replacement fin.

Additional embodiments of the invention include a method of forming a semiconductor structure, wherein the second replacement fin further comprises a cap layer formed over the second semiconductor material, wherein the cap layer is etch selective to the second semiconductor material.

Additional embodiments of the invention include a method of forming a semiconductor structure, further comprising: removing the cap layer from the first fin and removing the cap layer from the replacement fin prior to removing the cage spacers.

Additional embodiments of the invention include a method of forming a semiconductor structure, wherein the top surfaces of the replacement fin is atomically smooth after the cap is removed.

Additional embodiments of the invention include a method of forming a semiconductor structure, wherein the second semiconductor material is a III-V semiconductor material.

Additional embodiments of the invention include a method of forming a semiconductor structure, further comprising: forming an interconnect that electrically couples the first gate electrode to the second gate electrode.

Additional embodiments of the invention include a method of forming a semiconductor structure, wherein the semiconductor structure is a CMOS device.

Additional embodiments of the invention include a method of forming a semiconductor structure, wherein the first gate electrode has a P-type work-function and the second gate electrode has an N-type work function.

Additional embodiments of the invention include a method of forming a semiconductor structure, wherein the first fin has a thickness that is different than a thickness of the replacement fin.

Additional embodiments of the invention include a method of forming a semiconductor structure, wherein forming the replacement fin further comprises: epitaxially growing a buffer layer over the substrate; epitaxially growing a replacement channel layer over the buffer layer; and epitaxially growing a cap layer over the replacement channel layer.

Additional embodiments of the invention include a method of forming a semiconductor structure, wherein the buffer layer is a graded layer, wherein a top surface of the buffer layer has a different lattice spacing than a bottom surface of the buffer layer.

Embodiments of the invention include a semiconductor structure comprising: a substrate; a first fin formed over the substrate, wherein the first fin includes a first semiconductor material; a first cage structure formed adjacent to the first fin, wherein each sidewall of the first fin is spaced away from a nearest sidewall of the first cage by a first spacing; a first gate electrode formed over the first fin, wherein the first cage structure directly contacts the first gate electrode; a second fin formed over the substrate wherein the second fin comprises a buffer layer in contact with the substrate and a channel region formed over the buffer layer, wherein the channel region is formed with a III-V semiconductor material; a second cage structure formed adjacent to the second fin, wherein each sidewall of the second fin is spaced away from a nearest sidewall of the second cage by a second spacing; and a second gate electrode formed over the second fin, wherein the second cage structure directly contacts the second gate electrode.

Embodiments of the invention include a semiconductor structure, wherein the first semiconductor material is silicon and the channel region in the second fin is InGaAs.

Embodiments of the invention include a semiconductor structure, wherein the semiconductor structure forms a CMOS device, and further comprises: an interconnect that electrically couples the first gate electrode to the second gate electrode, and wherein the first fin is a component of a P-type transistor and the second fin is a component of an N-type transistor.

What is claimed is:

1. A semiconductor structure comprising:
   a substrate;
   a first fin formed over the substrate, wherein the first fin includes a first semiconductor material;
   a first cage structure formed adjacent to the first fin, wherein a first sidewall and a second sidewall that is opposite from the first sidewall of the first fin are both spaced away from a nearest sidewall of the first cage structure by a first spacing, and wherein the first cage structure does not contact any portion of the first fin;
   a first gate electrode formed over the first fin, and wherein a top surface of the first gate electrode is coplanar with a top surface of the first cage structure;
   a second fin formed over the substrate wherein the second fin includes a second semiconductor material, wherein the second semiconductor material is a III-V semiconductor material, and wherein the second fin comprises:
   a buffer layer in contact with the substrate; and
   an active region formed over the buffer layer, wherein the active region is formed from the second semiconductor material;
   a second cage structure formed adjacent to the second fin, wherein a third sidewall and a fourth sidewall that is opposite from the third sidewall of the second fin are both spaced away from a nearest sidewall of the second cage structure by a second spacing, and wherein the second cage structure does not contact any portion of the second fin;
   a second gate electrode formed over the second fin, and wherein a top surface of the second gate electrode is coplanar with a top surface of the second cage structure; and
   an interconnect that electrically couples the first gate electrode to the second gate electrode, wherein the interconnect directly contacts the first cage structure and the second cage structure.

2. The semiconductor structure of claim 1, wherein a top surface of the active region is atomically smooth.

3. The semiconductor structure of claim 1, wherein the buffer layer is a graded buffer layer.

4. The semiconductor structure of claim 1, wherein the buffer layer is GaAs and the channel region is InGaAs.

5. The semiconductor structure of claim 1, wherein the first semiconductor material is a III-V semiconductor material that is different than the second semiconductor material, and wherein the first semiconductor material is a different material than the substrate.

6. The semiconductor structure of claim 5, wherein the first fin further comprises a stack of semiconductor materials.

7. The semiconductor structure of claim 6, wherein the stack of semiconductor materials in the first fin is a SiGe/Ge/SiGe stack, wherein the Ge portion forms a channel region in the first fin.

8. The semiconductor structure of claim 1, wherein the first fin is a different height than the second fin.

9. The semiconductor structure of claim 1, wherein the semiconductor structure forms a complementary metal-oxide-semiconductor (CMOS) device.

10. The semiconductor structure of claim 1, wherein the first fin is a component of a P-type transistor and the second fin is a component of an N-type transistor.

11. A method of forming a semiconductor structure, comprising:
    forming a cap layer over a substrate formed with a first semiconductor material, wherein the cap layer is etch selective to the first semiconductor material;
    forming a first and a second fin in the substrate;
    forming a shallow trench isolation (STI) layer over the substrate and around the first and second fins;
    removing the second fin to form an opening in the STI layer;
    epitaxially growing a second semiconductor material in the opening to form a replacement fin;
    recessing the STI layer;
    forming spacers adjacent to the sidewalls of each of the first fin and the replacement fin;
    forming cage structures adjacent to the spacers;
    removing the spacers to form an opening between at least one cage structure and the first fin and to form an opening between at least one cage structure and the replacement fin;
    forming a first gate electrode over the first fin; and
    forming a second gate electrode over the replacement fin.

12. The method of claim 11, wherein the replacement fin further comprises a cap layer formed over the second semiconductor material, wherein the cap layer is etch selective to the second semiconductor material.

13. The method of claim 12, further comprising:
    removing the cap layer from the first fin and removing the cap layer from the replacement fin prior to removing the spacers.

14. The method of claim 13, wherein the top surfaces of the replacement fin is atomically smooth after the replacement cap is removed.

15. The method of claim 11, wherein the second semiconductor material is a III-V semiconductor material.

16. The method of claim 11, further comprising:
    forming an interconnect that electrically couples the first gate electrode to the second gate electrode.

17. The method of claim 16, wherein the semiconductor structure is a CMOS device.

18. The method of claim 11, wherein the first fin has a thickness that is different than a thickness of the replacement fin.

19. The method of claim 11, wherein forming the replacement fin further comprises:
    epitaxially growing a buffer layer over the substrate;
    epitaxially growing a replacement channel layer over the buffer layer; and
    epitaxially growing a cap layer over the replacement channel layer.

20. The method of claim 19, wherein the buffer layer is a graded layer, wherein a top surface of the buffer layer has a different lattice spacing than a bottom surface of the buffer layer.

21. A semiconductor structure comprising:
    a substrate;
    a first fin formed over the substrate, wherein the first fin includes a first semiconductor material;
    a first cage structure formed adjacent to the first fin, wherein a first sidewall and a second sidewall that is opposite from the first sidewall of the first fin are both spaced away from a nearest sidewall of the first cage structure by a first spacing, and wherein the first cage structure does not contact any portion of the first fin;
a first gate electrode formed over the first fin, wherein the first cage structure directly contacts the first gate electrode, and wherein a top surface of the first gate electrode is coplanar with a top surface of the first cage structure;
a second fin formed over the substrate wherein the second fin comprises a buffer layer in contact with the substrate and a channel region formed over the buffer layer, wherein the channel region is formed with a III-V semiconductor material;
a second cage structure formed adjacent to the second fin, wherein a third sidewall and a fourth sidewall that is opposite from the third sidewall of the second fin are both spaced away from a nearest sidewall of the second cage structure by a second spacing, and wherein the second cage structure does not contact any portion of the second fin;
a second gate electrode formed over the second fin, wherein the second cage structure directly contacts the second gate electrode, and wherein a top surface of the second gate electrode is coplanar with a top surface of the second cage structure; and
an interconnect that electrically couples the first gate electrode to the second gate electrode, wherein the interconnect directly contacts the first cage structure and the second cage structure.

22. The semiconductor structure of claim 21, wherein the first fin is a component of a P-type transistor and the second fin is a component of an N-type transistor.

* * * * *